US012751138B2

(12) United States Patent
Kato et al.

(10) Patent No.: US 12,751,138 B2
(45) Date of Patent: Sep. 29, 2026

(54) OLED WITH A FLATTENING LAYER BETWEEN TWO BARRIER LAYERS

(71) Applicant: Magnolia White Corporation, Tokyo (JP)

(72) Inventors: Daisuke Kato, Tokyo (JP); Kaichi Fukuda, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 0 days.

(21) Appl. No.: 18/661,794

(22) Filed: May 13, 2024

(65) Prior Publication Data

US 2024/0298462 A1 Sep. 5, 2024

Related U.S. Application Data

(63) Continuation of application No. 18/164,686, filed on Feb. 6, 2023, now Pat. No. 12,010,867, which is a
(Continued)

(30) Foreign Application Priority Data

Feb. 12, 2013 (JP) ................................ 2013-024910

(51) Int. Cl.
*H10K 50/844* (2023.01)
*H10K 50/11* (2023.01)
(Continued)

(52) U.S. Cl.
CPC ............ *H10K 59/12* (2023.02); *H10K 50/11* (2023.02); *H10K 59/1216* (2023.02);
(Continued)

(58) Field of Classification Search
CPC ...................... H10K 59/8722; H10K 59/8731
See application file for complete search history.

(56) References Cited

U.S. PATENT DOCUMENTS 8,093,612 B2 1/2012 Tanaka
RE43,442 E 6/2012 Hayashi et al.
(Continued)

FOREIGN PATENT DOCUMENTS

JP H10202153 A 8/1998
JP 2001518530 A 10/2001
(Continued)

OTHER PUBLICATIONS

Office Action issued on Jan. 16, 2015, in corresponding Korean Patent Application No. 10-2014-0013602.
(Continued)

*Primary Examiner* — Peter Bradford
(74) *Attorney, Agent, or Firm* — Maier & Maier, PLLC

(57) ABSTRACT

According to one embodiment, an organic semiconductor device includes a supporting substrate, a plurality of organic EL light emitting elements, a first barrier layer, a flattening layer, and a second barrier layer. The flattening layer exists sporadically and makes gentle in inclination steep elevation change present in the surface of the first barrier layer. The first barrier layer and the second barrier layer are made of moisture penetration preventive material.

20 Claims, 4 Drawing Sheets

Related U.S. Application Data continuation of application No. 16/819,873, filed on Mar. 16, 2020, now Pat. No. 11,600,801, which is a continuation of application No. 16/391,572, filed on Apr. 23, 2019, now Pat. No. 10,629,849, which is a continuation of application No. 15/726,028, filed on Oct. 5, 2017, now Pat. No. 10,319,947, which is a continuation of application No. 15/186,081, filed on Jun. 17, 2016, now Pat. No. 9,812,669, which is a continuation of application No. 14/818,499, filed on Aug. 5, 2015, now Pat. No. 9,466,813, which is a continuation of application No. 14/176,345, filed on Feb. 10, 2014, now Pat. No. 9,166,194.

(51) Int. Cl.

| | |
|---|---|
| ***H10K 59/12*** | (2023.01) |
| ***H10K 59/121*** | (2023.01) |
| ***H10K 59/122*** | (2023.01) |
| ***H10K 59/124*** | (2023.01) |
| ***H10K 59/80*** | (2023.01) |
| *H10K 102/00* | (2023.01) |

(52) U.S. Cl.

CPC ......... *H10K 59/122* (2023.02); *H10K 59/124* (2023.02); *H10K 59/8722* (2023.02); *H10K 59/8731* (2023.02); *H10K 59/1201* (2023.02); *H10K 2102/00* (2023.02)

(56) References Cited

U.S. PATENT DOCUMENTS

| | | | |
|---|---|---|---|
| 8,237,361 | B2 | 8/2012 | Imai et al. |
| 2001/0054867 | A1 | 12/2001 | Kubota |
| 2002/0008819 | A1 | 1/2002 | Yoshida |
| 2002/0134980 | A1 | 9/2002 | Armgarth et al. |
| 2002/0158568 | A1 | 10/2002 | Satake |
| 2003/0164674 | A1 | 9/2003 | Imamura |
| 2005/0007322 | A1 | 1/2005 | Adachi et al. |
| 2005/0057151 | A1 | 3/2005 | Kuwabara |
| 2006/0158111 | A1 | 7/2006 | Hayashi |
| 2007/0018566 | A1 | 1/2007 | Yamazaki et al. |
| 2007/0108889 | A1* | 5/2007 | Kim .................. H10K 59/8051 313/506 |
| 2009/0309486 | A1 | 12/2009 | Imai et al. |
| 2010/0117530 | A1 | 5/2010 | Lin et al. |
| 2010/0193817 | A1* | 8/2010 | Amamiya ............ H10K 59/122 257/98 |
| 2010/0253215 | A1 | 10/2010 | Fukagawa et al. |
| 2010/0295759 | A1 | 11/2010 | Tanaka |
| 2011/0156578 | A1 | 6/2011 | Jeon et al. |
| 2012/0044176 | A1 | 2/2012 | Nakamura et al. |
| 2012/0248422 | A1 | 10/2012 | Mine et al. |
| 2012/0280614 | A1 | 11/2012 | Imai et al. |
| 2013/0161680 | A1 | 6/2013 | Oh et al. |
| 2013/0220511 | A1 | 8/2013 | Suzuki et al. |
| 2013/0229107 | A1 | 9/2013 | Park |
| 2013/0328480 | A1 | 12/2013 | Joo et al. |
| 2013/0334511 | A1 | 12/2013 | Savas et al. |
| 2014/0217394 | A1 | 8/2014 | Kin et al. |
| 2014/0291626 | A1 | 10/2014 | Huh et al. |
| 2015/0053957 | A1 | 2/2015 | Sato et al. |
| 2015/0060815 | A1 | 3/2015 | Sato |
| 2015/0333292 | A1 | 11/2015 | Sato |
| 2019/0019993 | A1 | 1/2019 | Narutaki et al. |
| 2019/0058160 | A1 | 2/2019 | Kishimoto |

FOREIGN PATENT DOCUMENTS

| | | | |
|---|---|---|---|
| JP | 2002261046 | A | 9/2002 |
| JP | 2004281247 | A | 10/2004 |
| JP | 2005038842 | A | 2/2005 |
| JP | 2005504652 | A | 2/2005 |
| JP | 2005142063 | A | 6/2005 |
| JP | 2005285743 | A | 10/2005 |
| JP | 2007184251 | A | 7/2007 |
| JP | 2007250370 | A | 9/2007 |
| JP | 2008165251 | A | 7/2008 |
| JP | 4303591 | B2 | 7/2009 |
| JP | 2009164107 | A | 7/2009 |
| JP | 2009266922 | A | 11/2009 |
| JP | 2010086814 | A | 4/2010 |
| JP | 2010272270 | A | 12/2010 |
| JP | 201177028 | A | 4/2011 |
| JP | 2011141979 | A | 7/2011 |
| JP | 2011210544 | A | 10/2011 |
| JP | 201243201 | A | 3/2012 |
| JP | 201274238 | A | 4/2012 |
| JP | 2012099503 | A | 5/2012 |
| JP | 2012155987 | A | 8/2012 |
| JP | 2012160477 | A | 8/2012 |
| KR | 1020020082153 | A | 10/2002 |
| WO | 03029903 | A2 | 4/2003 |
| WO | 2009139391 | A1 | 11/2009 |
| WO | 2011108020 | A1 | 9/2011 |

OTHER PUBLICATIONS

Office Action issued on Apr. 26, 2016, in corresponding Japanese Patent Application No. 2013-024910, filed Feb. 12, 2013.

Office Action issued on Sep. 5, 2017, in corresponding Japanese Patent Application No. 2016-234036.

* cited by examiner

OLED WITH A FLATTENING LAYER BETWEEN TWO BARRIER LAYERS

CROSS-REFERENCE TO RELATED APPLICATIONS

This application is a continuation of and claims the benefit of priority under 35 U.S.C. § 120 from U.S. Ser. No. 18/164,686 filed on Feb. 6, 2023, which is a continuation of and claims the benefit of priority under 35 U.S.C. § 120 from U.S. Ser. No. 16/819,873 filed Mar. 16, 2020, which is a continuation of and claims the benefit of priority under 35 U.S.C. § 120 from U.S. Ser. No. 16/391,572 filed Apr. 23, 2019, which is a continuation of and claims the benefit of priority under 35 U.S.C. § 120 from U.S. Ser. No. 15/726,028 filed Oct. 5, 2017, which is a continuation of and claims the benefit of priority under 35 U.S.C. § 120 from U.S. Ser. No. 15/186,081 filed Jun. 17, 2016, which is a continuation of and claims the benefit of priority under 35 U.S.C. § 120 from U.S. Ser. No. 14/818,499 filed Aug. 5, 2015, which is a continuation of and claims the benefit of priority under 35 U.S.C. § 120 from U.S. Ser. No. 14/176,345 filed Feb. 10, 2014, and claims the benefit of priority under 35 U.S.C. § 119 from Japanese Patent Application No. 2013-024910 filed Feb. 12, 2013, the entire contents of each of which are incorporated herein by reference.

FIELD

Embodiments described herein relate generally to an organic semiconductor device and a method of manufacturing the same.

BACKGROUND

Organic electroluminescent display devices (organic EL display devices), each equipped with organic electroluminescent light emitting elements (organic EL light emitting elements), have been recently developed. The organic EL display devices are wide in viewing angle and require no backlighting, which allows making the display devices thin and light. Furthermore, the organic EL display devices feature lowness in power consumption and highness in response speed.

An organic EL display device has as its display elements organic electroluminescent elements (organic EL elements), each including a portion of an organic layer or an organic layer constituent, which is above a supporting substrate of glass, etc., and is held between an anode and a cathode. The organic layer includes a hole-injection layer, a hole-transport layer, an emitting layer, an electron-transport layer, an electron-injection layer, etc.

DETAILED DESCRIPTION

In general, according to one embodiment, there is provided an organic semiconductor device comprising: a supporting substrate; a plurality of pixels including a plurality of organic EL light emitting elements existent above the supporting substrate; a first barrier layer including a surface, extending over the plurality of pixels and covering the plurality of organic EL light emitting elements; a flattening layer sporadically existent on the first barrier layer and making gentle in inclination steep elevation change present in the surface of the first barrier layer; and a second barrier layer extending over the plurality of pixels and covering the first barrier layer and the flattening layer. The first barrier layer and the second barrier layer are made of moisture penetration preventive material.

According to another embodiment, there is provided a method of manufacturing an organic semiconductor device, comprising: forming a plurality of anodes and a plurality of organic layers including an emitting layer respectively, any one of the anodes and a corresponding one of the organic layers constituting a corresponding one of a plurality of pixels; forming a cathode covering the organic layer and extending over the pixels; forming out of moisture penetration preventive material a first barrier layer having a surface, covering the cathode and extending over the pixels; forming a flattening layer sporadically existent on the first barrier layer to make gentle in inclination any steep elevation change present in the surface of the first barrier layer; and forming out of moisture penetration preventive material a second barrier layer extending over the pixels and covering the first barrier layer and the flattening layer. The flattening layer is formed by vaporously spraying on the supporting substrate in a vacuum environment a solvent having been obtained by mixing a polymeric resin and a polymerization initiator so as to form bodies of the sprayed solvent sporadically existent on the supporting substrate, applying ultraviolet light to the bodies to cause the bodies to be cured and to form a sporadically existent polymeric resin layer, and removing thin film portions of the sporadically existent polymeric resin layer by etching.

Now, an organic semiconductor device and a method of manufacturing the organic semiconductor device of an embodiment will be hereinafter described with reference to the accompanying drawings.

Figure 1:
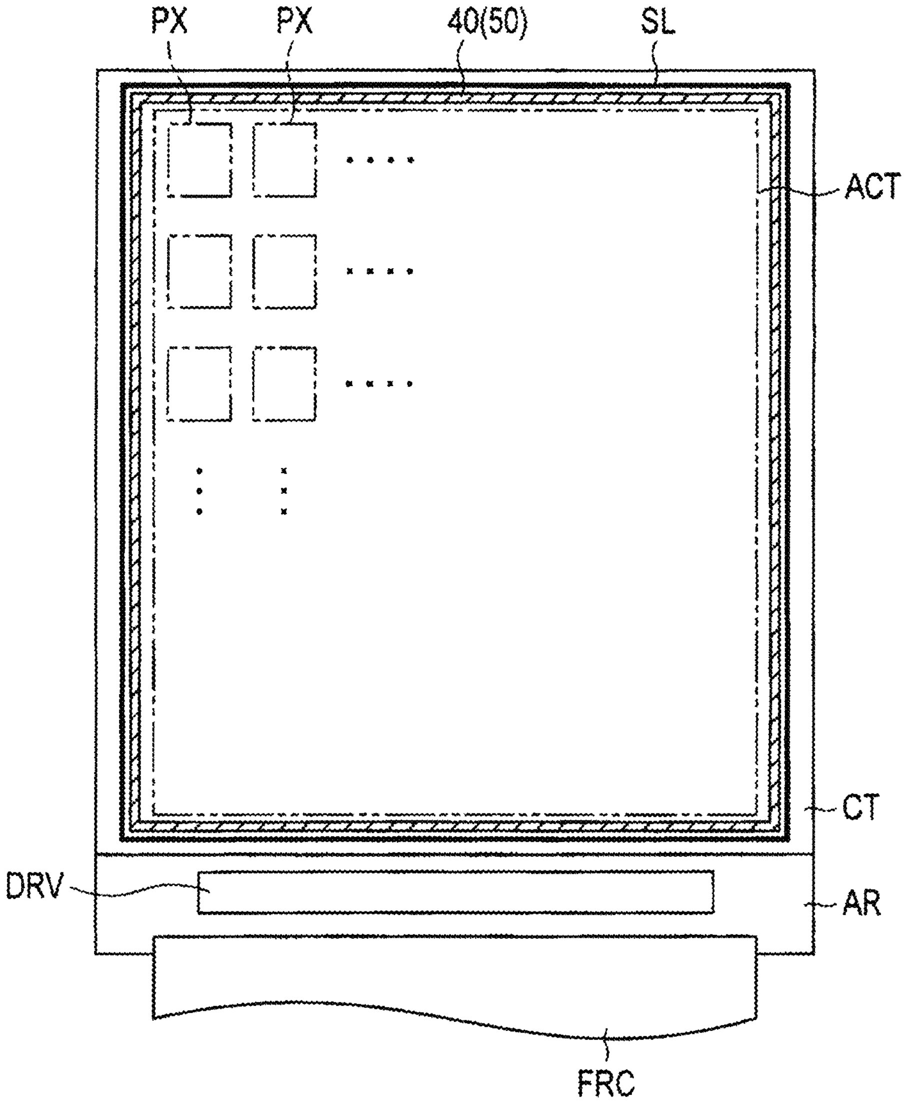
FIG. 1 is a drawing schematically indicating an exemplary structure of an organic semiconductor device of an embodiment.

FIG. 1 is a drawing schematically indicating an exemplary structure of an organic semiconductor device of the embodiment.

As shown in FIG. 1, the organic semiconductor device of the embodiment has an active area ACT, in which matrically arranged pixels PX are included, an array substrate AR, a counter-substrate CT, a driver DRV, and a flexible substrate FRC. It may be possible that the active area ACT translates into a display area for making an image display.

The array substrate AR and the counter-substrate CT are arranged opposite to each other and are fixed together by a sealing member SL arranged to surround the active area ACT.

The array substrate AR has the driver DRV for driving the pixels PX at its area outward extending from one end of the counter-substrate CT. The driver DRV operates in accordance with control signals and image signals inputted from outside through the flexible substrate FRC connected with one end of the outward extended area of the array substrate AR and outputs the control signals and the image signals to a non-illustrated source line, a non-illustrated gate line, etc.

Figure 2:
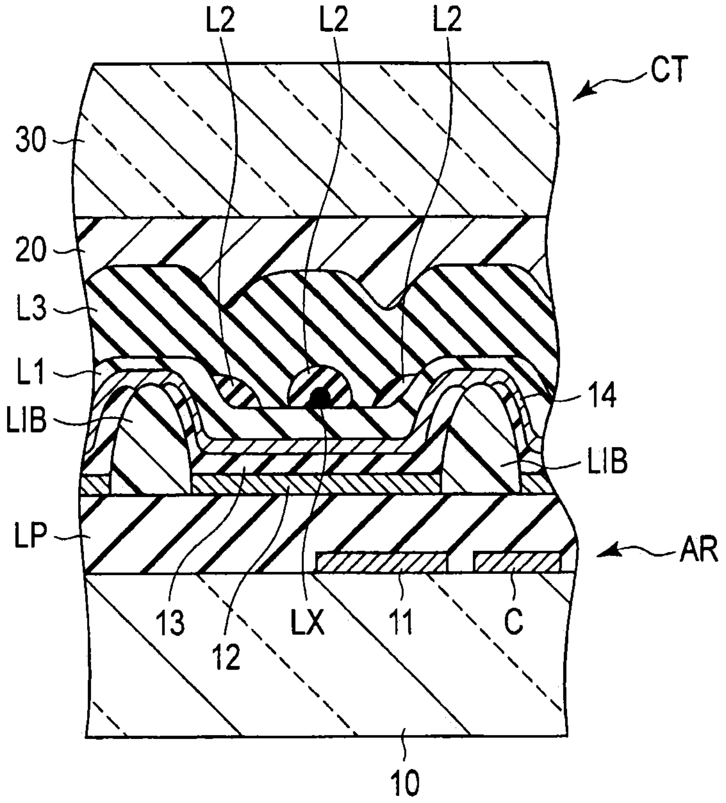
FIG. 2 is a cross-sectional view illustrating an exemplary structure of any pixel in the organic semiconductor device illustrated in FIG. 1.

FIG. 2 is a cross-sectional view illustrating an exemplary structure of any pixel in the organic semiconductor device illustrated in FIG. 1.

As shown in FIG. 2, the array substrate AR has a supporting substrate 10, a switching element 11, a storage capacitor C, an anode 12, an organic layer 13, a cathode 14, a first barrier layer L1, a flattening layer L2, and a second barrier layer L3.

The supporting substrate 10 is a transparent insulating glass substrate, for instance, and has on or above its surface the switching element 11, the storage capacitor C, the anode 12, the organic layer 13, the cathode 14, etc., all of which will be explained later.

The switching element 11 has a thin film transistor made of conductive layers and insulating layer all formed at the supporting substrate 10. Namely, switching element is formed simultaneously with various lines, such as the non-illustrated source line, the non-illustrated gate line, etc.

Any storage capacitor C is made of the conductive layers and the insulating layer all formed at the supporting substrate 10. In any capacitor, the storage capacitor couples with pixel capacitance formed between the anode 12 and the cathode 14.

A passivation film LP is formed to cover the switching element 11 and the storage capacitor C. The formation of the passivation film LP over the switching element 11 and the storage capacitor C provides electrical insulation between adjacent conductive bodies of the switching element 11 and the storage capacitor C, and between the switching element 11 and the anode 12. The passivation film LP has at every pixel PX a contact hole (not illustrated) allowing the switching element 11 and the anode 12, both at a pixel in question, to be electrically connected with each other. The passivation film LP is formed out of materials having electric non-conductance, such as $SiO_2$, SiN, acryl, polyimide, etc., for instance, and flattens any steep elevation change present on the surface because of the existence of the switching element 11 and the storage capacitor C.

The anode 12 is arranged on the passivation film LP at each pixel PX. The anode 12 is so constructed as to reflect light emitted from the organic layer 13 toward the cathode 14. For example, the anode 12 has a reflecting layer arranged on the passivation film LP and a transparent electrode arranged on the reflecting layer.

Each pixel PX may have its own reflecting layer for its own anode 12, or all the pixels PX may share one reflecting layer for their respective anodes 12. It is desirable that the reflecting layer should be as high as possible in optical reflectance. For instance, a metal film made of aluminum, silver (Ag), etc., may be used for a reflecting layer.

In the anode 12, the transparent electrode is electrically connected to the switching element 11 through a contact hole (not illustrated) provided in the passivation film LP for the anode in question. In the anode 12, a drive current is supplied from the drive circuit DRV through the switching element 11 to the transparent electrode.

In the anode 12, the transparent electrode comprises materials having transparency and conductivity. For instance, ITO (Indium Tin Oxide) or IZO (Indium Zinc Oxide) may be used as the materials having transparency and conductivity for making a transparent electrode for an anode 12.

A rib layer LIB is arranged between any adjacent anodes 12. The rib layer LIB prevents a corresponding one of the anodes 12 from coming in contact with the adjacent surrounding anodes and leakage current from occurring between the corresponding one of the anodes 12 and the cathode 14. The rib layer LIB is formed along the boundary of the pixels PX and surrounds the anodes 12. The rib layer LIB is about 2000 nm in height. The rib layer LIB is made of materials having electric non-conductance. For instance, the rib layer LIB is made of photosensitive resin materials.

The organic layer 13 is arranged on the anodes 12. The organic layer 13 has a function of emitting light. It does not matter if the light is of a white color or any other colors. It also does not matter if the organic layer 13 comprises organic layer constituents formed on the respective pixels PX or it entirely covers the region of the active area ACT where the pixels PX are arranged.

The organic layer 13 comprises from the side where anode 12 is located a hole-injection layer, which is not illustrated, a hole-transport layer, an emitting layer, an electron-transport layer, and an electron-injection layer, all of the layers being placed one upon another. It should be noted that the laminated structure of the organic layer 13 is not limited to what has been mentioned above but any laminated structure may be used as long as at least an emitting layer is included.

The emitting layer may be formed of any organic electroluminescent (EL) material that may emit light due to the fact that holes and electrons bond together when a drive current is supplied through an anode 12, for instance. Generally, any organic emitting material may be used as the organic electroluminescent material. More specifically, it is possible to use a widely known low weight molecular fluorescent material capable of emitting light in a singlet state, such as a coumarin-based, a perylene-based, a pyran-based, an anthrone-based, a porphyrin-based, a quinacridone-based, an N,N'-dialkyl substitution quinacridone-based, a naphthalimide-based, an N,N'-diaryl substitution pyrrolopyrrole-based, or a widely known low weight molecular phosphorescent material capable of emitting light in a triplet state of a rare-earth metal complex-based.

The cathode 14 is arranged on the organic layer 13. The cathode 14 is shared among the pixels PX. Namely, the cathode 14 extends over the pixels PX. For instance, the cathode 14 is formed to cover the entire region of the active area ACT where the pixels are arranged.

The cathode 14 is made of transparent electrode material. More specifically, the cathode 14 may be made of material having transparency and conductivity, such as ITO or IZO, for instance.

An organic EL light emitting element functioning as a light emitting source comprises one of the anodes 12, the organic layer 13, and the cathode 14. As apparent from the above, organic EL light emitting elements are located above the supporting substrate 10 and are formed at the respective pixels PX.

As explained above, a foundation layer is provided on the supporting substrate 10. The foundation layer comprises some members that are above the supporting substrate 10 and below the first barrier layer L1. The foundation layer includes organic EL light emitting elements, etc. The foundation layer is used as the foundation for the first barrier layer L1.

The first barrier layer L1 extends over the pixels PX and covers the organic EL light emitting elements. The first barrier layer L1 is provided on the cathode 14. The first barrier layer L1 is made of moisture penetration preventive material. The first barrier layer L1 is a protective transparent insulator film that prevents oxygen and moisture from entering the organic layer 13 and the rest layers. The first barrier layer L1 may be made of silicon nitride (SiN), and is formed to entirely cover the active area ACT.

The flattening layer L2 is provided on the first barrier layer L1. The flattening layer L2 comprises organic layer constituents that are located only at stepped portions produced by the structure of the lower layers, and makes gentle in inclination all the steep elevation changes present in the surface of the first barrier layer. Namely, the provision of the flattening layer L2 makes gentle all the steep elevation changes scattered in the surface where the second barrier layer L3 is formed, and thus makes it possible to prevent the second barrier layer L3 from cracking. Organic matter may be preferable as material for the flattening layer L2. Specifically, polymeric resin such as acrylic resin may be used. It should be noted that preferable material for the flattening layer L2 is not limited to acrylic resin alone.

The rib layer forming the ribs LIB is higher than any other layers. Therefore, step difference will occur at a boundary between the rib LIB and the anodes 12. The first barrier layer L1 therefore will have sharp slopes, each inclining substantially at a right angle at a boundary between the rib LIB and the anodes 12. The flattening layer L2 is formed by causing liquefied polymer to sporadically coagulate at stepped portions produced by the sharp slopes, owing to the surface tension of the liquefied polymer, and then to be cured with ultraviolet light.

When a foreign matter LX is accidentally introduced and forms a bump on the first barrier layer L1, the formation of the flattening layer L2 causes liquefied polymer to coagulate around the foreign matter LX owing to the surface tension of the liquefied polymer and makes gentle in inclination the steep elevation changes around the foreign matter LX.

It is desirable that the flattening layer L2 should ease the steep elevation changes and be sporadically formed. When the flattening layer L2 is formed to spread without any spaces, thinly spread portions should be removed by etching from the flattening layer L2 to make the flattening layer L2 to sporadically spread.

The second barrier layer L3 extends over the pixels PX, and is provided on the first barrier layer L1 and the flattening layer L2. The second barrier layer L3 is made of moisture penetration preventive material. The second barrier layer L3 prevents oxygen and moisture from entering the first barrier layer L1 and the flattening layer L2, or any of the layers that are below the second barrier layer L3 and are at the side of the supporting substrate 10. The second barrier layer L3 may be made of silicon nitride (SiN), for instance, and is formed to entirely cover the upper surface of the sporadically extending flattening layer L2 and those surfaces of the first barrier layer L1 that are exposed from the sporadically extending flattening layer L2. The flattening layer L2 makes gentle in inclination any steep elevation change on the surface of the first barrier layer L1, so that it is possible to prevent the second barrier layer L3 from cracking when the second barrier layer L3 is laid on the flattening layer 12. It is desirable that any slope of the flattening layer L2 sporadically extending on the first barrier layer L1 should meet the surface of the substrate at an angle that is equal to or lower than a predetermined angle, so that the second barrier layer L3 should not crack.

As having been explained above, organic EL light emitting elements are all covered with a first barrier layer L1 of about 400 nm, a flattening layer L2 of a predetermined thickness, and a second barrier layer L3 of about 400 nm. The layers are successively placed one upon another in the mentioned order from the lowest layer to form a multi layered structure comprising two barrier layers and one flattening layer. Therefore, even if there are areas that are insufficiently covered with the first barrier layer due to the presence of accidentally introduced foreign matters, the flattening layer L2 placed on the first barrier layer L1 surely covers the foreign matters and makes gentle any steep elevation changes sporadically present in the first barrier layer L1. As a result, an almost flat surface will be obtained, which makes it possible to form the second barrier layer L3 over the almost flat surface of the polymeric resin layer. Therefore, moisture penetration will be surely prevented. It should be noted that, when the above-mentioned three layered structure is regarded as a smallest unit, the adoption of a layered structure having at least two such units will produce similar effect.

The first barrier layer L1 and the second barrier layer L3 may be formed of moisture penetration preventive material, such as silicon nitride, silicon oxide, or silicon oxynitride.

The flattening layer L2 may be formed of macromolecular organic material cured by polymerization reaction, such as acrylic resin, epoxy resin, polyimide resin, etc.

The second barrier layer L3 is covered with the counter-substrate CT, and filler 20 is filled between them, for instance. The counter-substrate CT includes a transparent insulating substrate 30, which is made of glass, for instance. The counter-substrate CT is smaller than the supporting substrate 10 in perimeter.

Now, one example of a method of manufacturing the organic semiconductor devices in the present embodiment will be explained.

Figure 3:
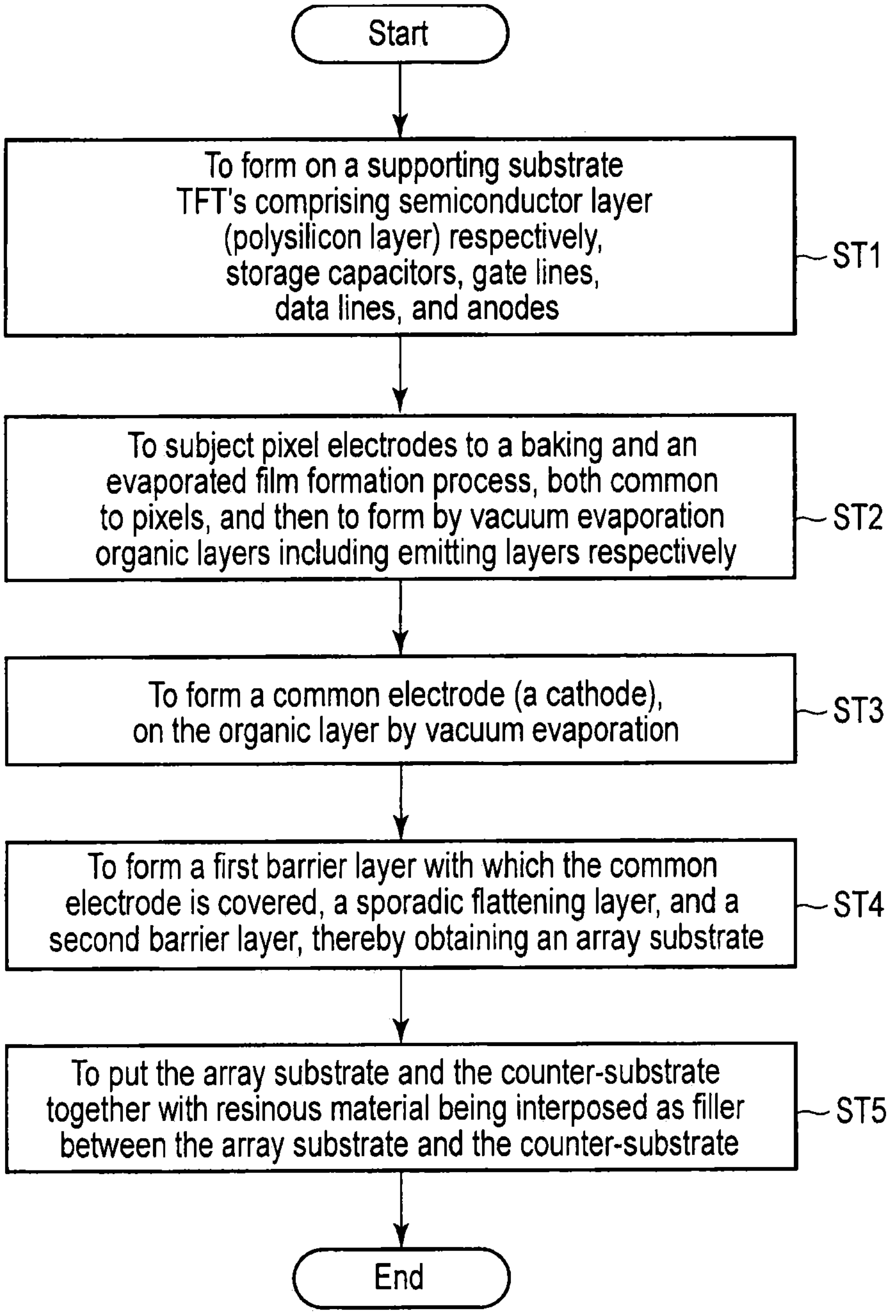
FIG. 3 is a flowchart explaining an exemplary method of manufacturing the organic semiconductor devices belonging to the embodiment.

FIG. 3 is a flowchart explaining an exemplary method of manufacturing the organic semiconductor devices in the present embodiment.

By repeating a deposition and patterning with using conductive material and insulating material, switching elements 11 comprising thin film transistor, storage capacitors C, gate line, data line and pixel electrodes (anodes 12) (Step ST1). A semiconductor layer of the thin film transistor may be made of polysilicon.

Subsequently, the pixel electrodes are subjected to a baking and an evaporated film formation process, which are both common to pixels PX. An organic layer 13 including emitting layer is formed by vacuum evaporation, which is executed with using a high-definition mask having openings only at those locations that correspond to the respective pixels PX and require that the respective organic layers 13 should be formed for each color (Step ST2). In this way, every pixel PX is made to have one of the pixel electrodes and one of the organic layers 13.

Afterwards, a cathode 14, which is a common electrode, is formed by vacuum evaporation to cover all of the pixels PX's and all of the portions of the organic layer 13 (Step ST3).

Then, a first barrier layer L1, a flattening layer L2, and a second barrier layer L3 are successively formed to entirely cover an active area ACT in their individual ways for protecting the organic layer 13 from moisture (Step ST4). It should be noted that any organic semiconductor device including organic EL light emitting elements is weak at moisture and that a dark spot tends to occur at an area where an organic layer is subjected to moisture penetration because the moisture penetration causes the organic layer to deteriorate in its characteristics, resulting in failure in light emission. A barrier layer for insulating the organic EL light emitting element from moisture is provided above the organic EL light emitting element.

A silicon nitride (SiN) film is frequently employed as a barrier layer for preventing moisture intrusion. The organic EL light emitting element is weak in heat, due to which it is required to form a barrier layer at a low temperature such as not higher than 100° C. Therefore, it is plasma CVD that is suitable for the formation of a barrier layer when one wishes to obtain a flat film without having any foreign body.

However, if there should be any pinhole at a barrier film due to the presence of any foreign body, moisture may externally intrude with the passage of time, which may result in the progressive failure on the market. Therefore, a thick barrier film that can sufficiently cover each and every foreign body is required to sufficiently lower the probability of occurrence of defectives. However, it is very difficult to form a thick film having a thickness of about 5 μm or 10 μm, for instance, with the use of a plasma CVD method because of problematic issues of productivity and costs.

Furthermore, since a silicon nitride film has light absorption at a shortwave region, a barrier structure having a thick silicon nitride film makes it very difficult to allow an effective passage of a blue ray emitted from an organic EL light emitting element. Therefore, there is proposed a multilayered thin film comprising a barrier film having a sufficient water preventive function and a covering film covering foreign bodies with polymeric resin material. However, should a flattening layer which is to be a foreign body covering layer is formed over the entire surface of the substrate, there would be the possibility that moisture may infiltrate a substrate through the perimeter of the substrate, move on through the flat layer and spread over the whole of an active area.

To avoid these risks, it is proposed that a flattening layer should be sporadically formed at the perimeter of a substrate by using a masking method and that the flattening layer should be wholly covered including the sporadically formed perimetrical portion of the flattening layer with a barrier layer to prevent moisture from spreading over from the perimeter of the substrate. However, the distance from any light emitting portion of the device to the outside edge of the substrate must be as short as possible to meet the requirements of the recent display devices. Furthermore, should one wish to obtain much more substrates than ever from a single mother glass substrate, the mask should be very narrow in the spaces separating the adjacent substrates in the mother glass substrate. In addition, the production of such masks is technically very difficult. Moreover, the actual use of the masks will require additional costs because the masks must be washed, for instance.

To cope with the above problems, the present embodiment proposes to prevent water from spreading over by sporadically forming the whole of the flattening layer in a layered structure comprising barrier layers and a flattening layer. For example, a barrier layer is formed in the first place with the use of a plasma CVD method at a substrate temperature of not higher than 100° C., for instance, at a substrate temperature of 60° C.

After that, a solvent which is a mixture of polymeric resin and polymerization initiator is vaporously sprayed on the supporting substrate 10 in the vacuum environment. The polymeric resin is adjusted so as not to form a continuous film by means of the optimization of the solvent supply conditions (such as supply period of time, substrate temperature, film forming atmosphere, etc.). When spraying the solvent, the supply amount of the solvent is made small and a sporadic film is formed. For example, it is desirable that the solvent is sprayed to form a layer which is not more than ⅕ of a rib layer LIB in height when forming a flattening layer on the flat region. It should be noted that the bodies of the polymer sporadically located on the substrate individually behave as liquid does, and they gather at foreign bodies or stepped portions and stay there because of their individual surface tension. In contrast, no body of the polymer resin will adhere to any flat region where neither stepped portions nor foreign bodies are present.

Then, the bodies of the sprayed solvent are individually applied with ultraviolet light, which causes the bodies of the polymeric resin to be cured as they are, thus to adhere to the foreign bodies or the stepped portions, and to constitute a layer of the polymeric resin. The layer of the polymeric resin thus formed is in existence as a sporadic layer, so that it will never be a distribution channel for external moisture and it will surely cover only the foreign bodies and the stepped portions. It should be noted that, if a thin film of the polymeric resin should be formed on a flat region owing to the solvent spraying condition, it would be desirable that the thin film should be removed from the layer of the polymeric resin by etching.

A further barrier film will be formed over the sporadic layer of the polymeric resin with the use of a plasma CVD method at a substrate temperature of not higher than 100° C., for instance, at a substrate temperature of 60° C. This process surely makes it possible to form a sealing film which does not impair its moisture preventive characteristic even on a substrate which has foreign bodies or stepped portions on its surface.

Then, affixation of the counter-substrate CT is executed with a resinous material used as filler 20 (Step ST5).

The above mentioned way of forming an organic semiconductor device makes it possible to prevent moisture from entering the organic EL light emitting elements. Therefore, no dark spot will occur and thus deterioration in quality will be prevented. In addition, any intrusion of moisture will be surely prevented without making thick the barrier layer covering the organic EL light emitting elements, due to which decrease in transmittance of the light emitted from the organic layer 13 will never occur. Therefore, the present embodiment makes it possible to provide highly reliable organic semiconductor devices and a method of manufacturing highly reliable organic semiconductor devices.

Figure 4:
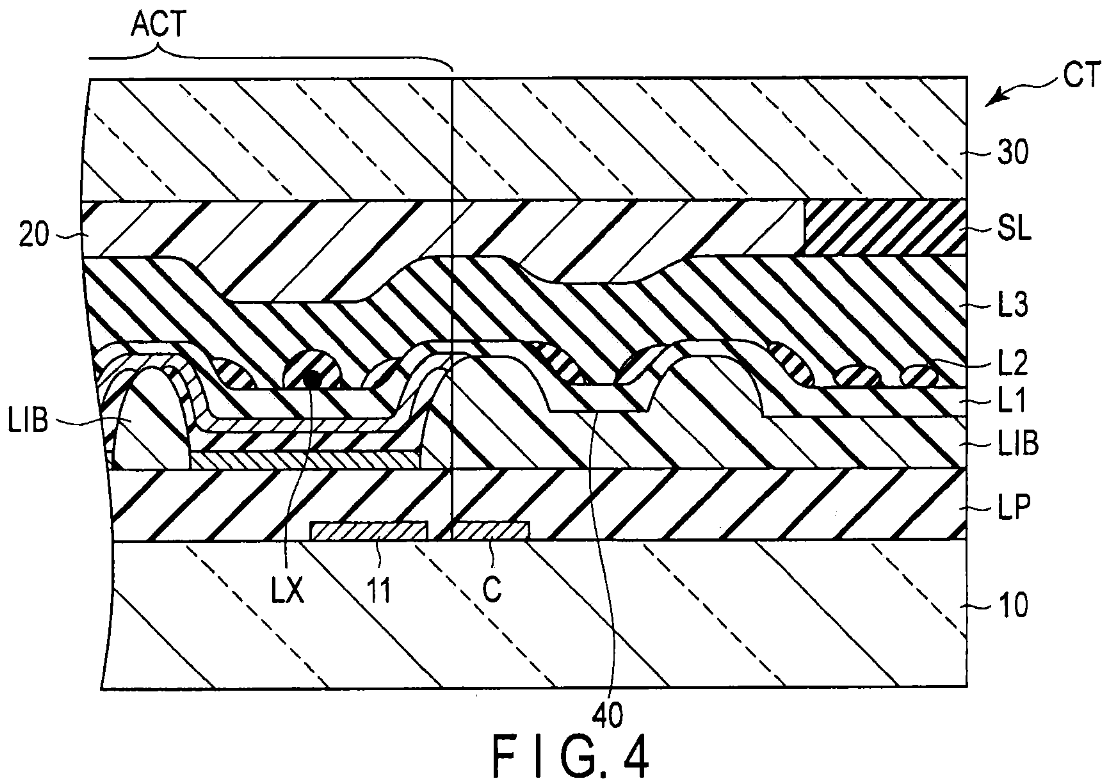
FIG. 4 is a drawing illustrating an exemplary cross-section of the region surrounding the active area of the organic semiconductor device.

FIG. 4 is a drawing illustrating an exemplary cross-section of the region surrounding the active area of one of the above-mentioned organic semiconductor devices.

It is possible in the present embodiment that the foundation layer of the first barrier layer L1 has at its perimeter a concave portion (or a convex portion) surrounding the active area. In the example that is illustrated in FIG. 4, the concave portion 40 is provided at the rib layer LIB which constitutes the foundation layer of the first barrier layer L1. As illustrated in FIG. 1, the concave portion 40 is formed in between the active area ACT and the sealant SL, and surrounds the active area ACT. It is desirable that the concave portion should be 10 to 100 μm or 20 to 50 μm in line width-to-space width ratio (L/S), for instance, and it is desirable that the depth of the concave portion 40 should be 1 to 10 μm, for instance.

It should be noted that the provision of the concave 40 surrounding the active area ACT provides steep elevation change at the surface of the first barrier layer L1 which covers the concave portion 40. The flattening layer L2 will be formed on the first barrier layer L1 in such a manner that the bodies of the polymeric resin gather together only at the stepped portions of the first barrier layer L1 but will never be formed on any flat portion, so that the flattening layer L2 will sporadically extend over the layer covering the concave region 40. The flattening layer L2 therefore separates the layer covering the concave portion 40 into an active area ACT side and an external environment side, so that moisture will be prevented from entering into and spreading over the active area ACT. In addition, no mask is required to form a sporadic flattening layer, so that it will be possible to reduce facility costs or operating costs and to narrow the frame of any display device.

Figure 5:
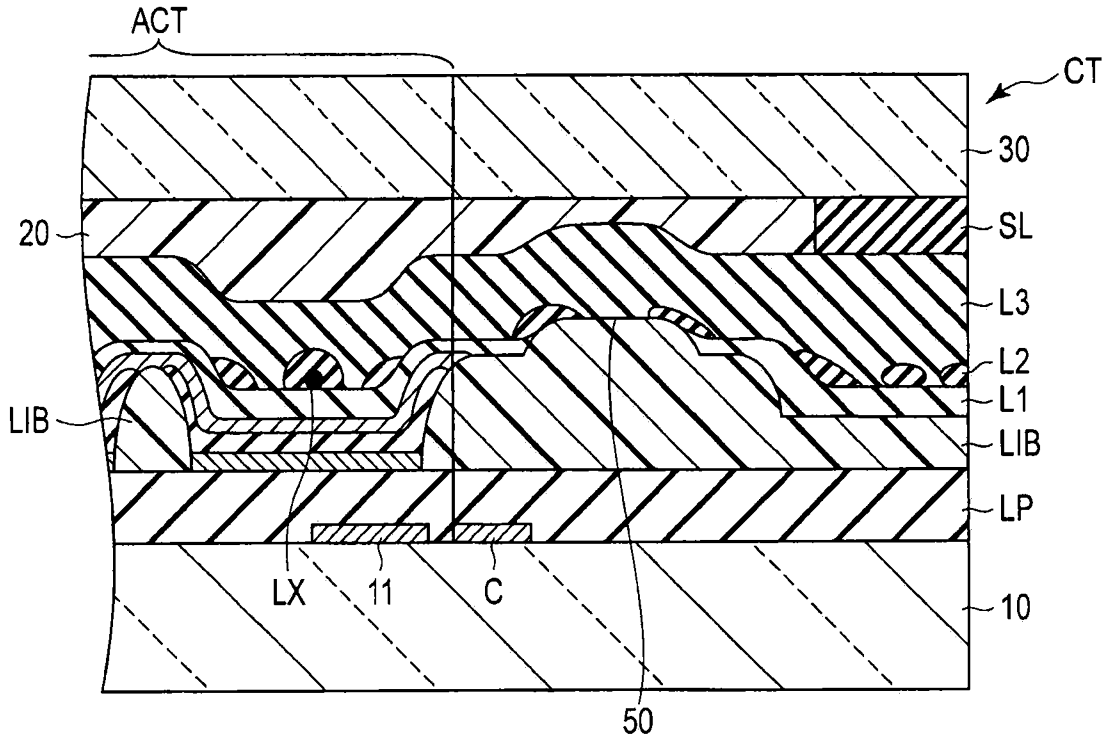
FIG. 5 is a drawing illustrating another exemplary cross-section of the region surrounding the active area of the organic semiconductor device.

FIG. 5 is a drawing illustrating an exemplary cross-section of the region surrounding the active area of the above-mentioned organic semiconductor device.

The example illustrated in FIG. 5 has a convex portion 50 at the rib layer LIB which constitutes the foundation layer of the first barrier layer L1. As illustrated in FIG. 1, the convex portion 50 is formed in between the active area ACT and the sealant SL, and surrounds the active area ACT. It is desirable, for instance, that the L/S of the convex portion should be 10 to 100 μm, and that the height of the convex portion 50 should be 1 to 10 μm.

It should be noted that the provision of the convex portion 50 surrounding the active area ACT provides steep elevation change at the surface of the first barrier layer L1 which covers the convex portion 50. The flattening layer L2 will be formed on the first barrier layer L1 in such a manner that the bodies of the polymeric resin, constituents of the flattening layer L2, gather together only at the stepped portions of the first barrier layer L1 but will never be located on any flat portion, as explained above, and the first barrier layer L1 is flat at the region covering the top of the convex portion 50 because the convex portion 50 is flat at its top, as illustrated in FIG. 5, so that the flattening layer L2 will be separated at the flat top of the first barrier layer L1 or the flat top of the convex region 50 into an active area ACT side layer portion and an external environment side layer portion. Therefore, moisture will be surely prevented from entering into and spreading over the active area ACT. In addition, no mask is required to form the sporadic flattening layer, so that it will be possible to reduce facility costs or operating costs and to narrow the frame of any display device.

It should be noted that the example illustrated in FIG. 4 and that in FIG. 5 respectively have only one concave portion 40 and only one convex portion 50, but it may be expected that much more excellent effect will be obtained if two or more concave portions or two or more convex portions are formed. For example, it may be possible to additionally form at least one more concave portion 40 or at least one more convex portion 50 at a location surrounding the active area ACT in such a manner that the additionally formed concave portion 40 or convex portion 50 faces the sealant SL, or is provided between the active area ACT and the sealant SL, or is provided on the perimeter which is outside and all around the sealant SL. The provision of at least one concave portion 40 or convex portion 50 that surrounds the active area ACT makes it possible to sufficiently obtain the above-mentioned sealing effect.

The embodiments having been explained above make it possible to provide highly reliable organic semiconductor devices and a method of manufacturing highly reliable organic semiconductor devices.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Hitherto, an organic EL light emitting element, a component of a display device, has been explained as an embodiment of an organic semiconductor device, but it is possible that the organic semiconductor device is an organic transistor or an organic solar cell.

What is claimed is:

1. An organic electroluminescent display device comprising:

a substrate including a display area and a peripheral area surrounding the display area;

a pixel in the display area, the pixel including a pixel electrode, organic layers including a light emitting layer and located in the display area, and a common electrode, the organic layers being disposed between the pixel electrode and the common electrode;

a first inorganic insulating layer covering the pixel and disposed in both the display area and the peripheral area continuously;

a second inorganic insulating layer disposed at an opposite side of the first inorganic insulating layer from the substrate, being in contact with the first inorganic insulating layer, and disposed in both the display area and the peripheral area continuously; and a first organic insulating layer and a second organic insulating layer that are disposed in a same layer and on the first inorganic insulating layer, and are in contact with the first and second inorganic insulating layers, wherein the pixel electrode overlaps both the first organic insulating layer and the second organic insulating layer, the second inorganic insulating layer covers the first and second organic insulating layers, and the first inorganic insulating layer is in contact with the second inorganic insulating layer in a region between the first organic insulating layer and the second organic insulating layer, the region overlapping the pixel electrode.

2. The organic electroluminescent display device according to claim 1, wherein the first organic insulating layer is encompassed by the first and second inorganic insulating layers, and the second organic insulating layer is encompassed by the first and second inorganic insulating layers.

3. The organic electroluminescent display device according to claim 1, wherein the first inorganic insulating layer is in contact with the second inorganic insulating layer in the peripheral area.

4. The organic electroluminescent display device according to claim 1, wherein the first and second organic insulating layers are disposed in the display area.

5. The organic electroluminescent display device according to claim 4, wherein the first and second organic insulating layers overlap the pixel in a plan view.

6. The organic electroluminescent display device according to claim 5, further comprising a third organic insulating layer disposed in the same layer, wherein the third organic insulating layer overlaps the pixel in a plan view and is disposed between the first organic insulating layer and the second organic insulating layer.

7. The organic electroluminescent display device according to claim 1, wherein the first and second organic insulating layers are disposed in the peripheral area.

8. The organic electroluminescent display device according to claim 1, wherein the first organic insulating layer is disposed in the display area, and the second organic insulating layer is disposed in the peripheral area.

9. The organic electroluminescent display device according to claim 1, wherein the first inorganic insulating layer includes a flat surface, a first inclined surface, and a second inclined surface, the flat surface is disposed between the first inclined surface and the second inclined surface in a cross-sectional view, the first organic insulating layer is in contact with both the flat surface and the first inclined surface, and the second organic insulating layer is in contact with both the flat surface and the second inclined surface.

10. The organic electroluminescent display device according to claim 1, wherein the first inorganic insulating layer includes a first portion, a first inclined surface protruding from the first portion toward the second inorganic insulating layer, and a second inclined surface protruding from the first portion toward the second inorganic insulating layer, the first portion is disposed between the first inclined surface and the second inclined surface in a cross-sectional view, the first portion includes a second portion in contact with the first inclined surface and a third portion in contact with the second inclined surface, the first organic insulating layer is disposed at the second portion, and the second organic insulating layer is disposed at the third portion.

11. The organic electroluminescent display device according to claim 10, further comprising a third organic insulating layer on the pixel electrode, under the organic layers, and under the common electrode, wherein the third organic insulating layer surrounds the pixel electrode and includes a first side wall and a second side wall that are in contact with the pixel electrode, a part of the pixel electrode is disposed between the first side wall and the second side wall in the cross-sectional view, the first inclined surface faces the first side wall via the common electrode, and the second inclined surface faces the second side wall via the common electrode.

12. The organic electroluminescent display device according to claim 10, further comprising a third organic insulating layer on the pixel electrode, under the organic layers, and under the common electrode, wherein the third organic insulating layer surrounds the pixel electrode, and includes a concave portion in the peripheral area, the concave portion includes a third side wall and a fourth side wall that face each other in the cross-sectional view, the first inclined surface faces the third side wall, and the second inclined surface faces the fourth side wall.

13. The organic electroluminescent display device according to claim 12, wherein the first inclined surface is in contact with the third side wall, and the second inclined surface is in contact with the fourth side wall.

14. The organic electroluminescent display device according to claim 10, further comprising a third organic insulating layer on the pixel electrode, under the organic layers, and under the common electrode, wherein the third organic insulating layer surrounds the pixel electrode, and includes a convex portion in the peripheral area, the convex portion includes a fifth side wall and a sixth side wall that face each other in the cross-sectional view, the first inclined surface faces the fifth side wall, and the second inclined surface faces the sixth side wall.

15. The organic electroluminescent display device according to claim 10, further comprising a third organic insulating layer on the pixel electrode, under the organic layers, and under the common electrode, wherein the third organic insulating layer surrounds the pixel electrode, and includes a convex portion over the display area and the peripheral area and on a boundary of the display area and the peripheral area, the convex portion includes a fifth side wall and a sixth side wall that face each other in the cross-sectional view, the first inclined surface faces the fifth side wall, and the second inclined surface faces the sixth side wall.

16. An organic electroluminescent display device comprising:

a substrate including a display area and a peripheral area surrounding the display area;

pixels in the display area, each of the pixels including a light emitting layer that is located in the display area;

a first inorganic insulating layer covering the pixels and disposed in both the display area and the peripheral area continuously;

a second inorganic insulating layer disposed at an opposite side of the first inorganic insulating layer from the substrate, being in contact with the first inorganic insulating layer, covering the pixels, and disposed in both the display area and the peripheral area continuously; and a first organic insulating layer and a second organic insulating layer that are disposed in a same layer and on the first inorganic insulating layer, and are in contact with the first and second inorganic insulating layers, wherein the pixels include a first pixel with a first pixel electrode, the first pixel electrode overlaps both the first organic insulating layer and the second organic insulating layer in the first pixel, the second inorganic insulating layer covers the first and second organic insulating layers, and the first inorganic insulating layer is in contact with the second inorganic insulating layer in a region between the first organic insulating layer and the second organic insulating layer, the region overlapping the first pixel electrode.

17. The organic electroluminescent display device according to claim 16, wherein the first inorganic insulating layer covers a whole of the display area.

18. The organic electroluminescent display device according to claim 16, wherein the first inorganic insulating layer includes a first portion, a first inclined surface protruding from the first portion toward the second inorganic insulating layer, and a second inclined surface protruding from the first portion toward the second inorganic insulating layer, the first portion is disposed between the first inclined surface and the second inclined surface in a cross-sectional view, the first portion includes a second portion in contact with the first inclined surface and a third portion in contact with the second inclined surface, the first organic insulating layer is disposed at the second portion, and the second organic insulating layer is disposed at the third portion.

19. The organic electroluminescent display device according to claim 18, further comprising a third organic insulating layer, wherein the third organic insulating layer delimits the pixels and includes a first side wall and a second side wall that face the light emitting layer, the first inclined surface faces the first side wall via the light emitting layer, and the second inclined surface faces the second side wall via the light emitting layer.

20. The organic electroluminescent display device according to claim 18, further comprising a third organic insulating layer, wherein the third organic insulating layer delimits the pixels and includes a concave portion in the peripheral area, the concave portion includes a third side wall and a fourth side wall that face each other in the cross-sectional view, the first inclined surface faces the third side wall, and the second inclined surface faces the fourth side wall.

* * * * *